(12) United States Patent
Matthey et al.

(10) Patent No.: US 11,374,425 B2
(45) Date of Patent: Jun. 28, 2022

(54) BATTERY ENERGY STORAGE SYSTEM, BATTERY MANAGEMENT SYSTEM, AND CONTROL METHOD FOR CONTROLLING BATTERY TEMPERATURE

(71) Applicant: Hitachi Automotive Systems, Ltd., Hitachinaka (JP)

(72) Inventors: Fanny Matthey, Tokyo (JP); Shin Yamauchi, Tokyo (JP); Kei Sakabe, Tokyo (JP); Ryohhei Nakao, Hitachinaka (JP); Daiki Komatsu, Tokyo (JP); Keiichiro Ohkawa, Hitachinaka (JP)

(73) Assignee: Vehicle Energy Japan Inc., Hitachinaka (JP)

( * ) Notice: Subject to any disclaimer, the term of this patent is extended or adjusted under 35 U.S.C. 154(b) by 360 days.

(21) Appl. No.: 16/333,945

(22) PCT Filed: Feb. 6, 2018

(86) PCT No.: PCT/JP2018/003904
§ 371 (c)(1),
(2) Date: Mar. 15, 2019

(87) PCT Pub. No.: WO2018/179854
PCT Pub. Date: Oct. 4, 2018

(65) Prior Publication Data
US 2019/0207406 A1 Jul. 4, 2019

(30) Foreign Application Priority Data
Mar. 30, 2017 (JP) .............................. JP2017-066634

(51) Int. Cl.
*H02J 7/00* (2006.01)
*H01M 10/48* (2006.01)
(Continued)

(52) U.S. Cl.
CPC ............ *H02J 7/0091* (2013.01); *G01R 31/36* (2013.01); *H01M 10/48* (2013.01);
(Continued)

(58) Field of Classification Search
CPC ...... H02J 7/0091; H02J 7/0029; H02J 7/0021; H02J 7/045; H02J 7/007192;
(Continued)

(56) References Cited

U.S. PATENT DOCUMENTS

2009/0085527 A1* 4/2009 Odaohhara ........... H02J 7/0091
320/150
2013/0033790 A1 2/2013 Kobayakawa et al.
(Continued)

FOREIGN PATENT DOCUMENTS

JP 2009-77466 A 4/2009
WO WO 2011/132561 A1 10/2011
(Continued)

OTHER PUBLICATIONS

International Search Report (PCT/ISA/210) issued in PCT Application No. PCT/JP2018/003904 dated May 1, 2018 with English translation (five pages).
(Continued)

*Primary Examiner* — Nathaniel R Pelton
(74) *Attorney, Agent, or Firm* — Crowell & Moring LLP

(57) ABSTRACT

Provided is a battery system in which a battery cell does not exceed a use limit temperature, and a time taken for returning to the charging/discharging process is shortened even if a frequency for the battery system to stop a charging/discharging process is reduced and the charging/discharging process is stopped. The battery system disclosed in the invention includes a plurality of battery cells and a control circuit which controls a charging/discharging current of the battery cell. The control circuit performs a plurality of
(Continued)

temperature rising estimations on the basis of a battery temperature, a charging/discharging current, and a time width of a time window. The control circuit selects the charging/discharging current corresponding to a temperature rising estimation in which the temperature of the battery cell does not exceed a use limit temperature among the temperature rising estimations.

1 Claim, 7 Drawing Sheets

(51) Int. Cl.
G01R 31/36 (2020.01)
G01R 31/382 (2019.01)
H02J 7/04 (2006.01)

(52) U.S. Cl.
CPC ......... H01M 10/486 (2013.01); H02J 7/0029 (2013.01); *G01R 31/382* (2019.01); *H02J 7/0021* (2013.01); *H02J 7/007192* (2020.01); *H02J 7/045* (2013.01); *H02J 2007/0067* (2013.01)

(58) Field of Classification Search
CPC ............. H02J 2007/0067; G01R 31/36; G01R 31/382; H01M 10/48; H01M 10/486
USPC ........................................................ 320/134
See application file for complete search history.

(56) References Cited

U.S. PATENT DOCUMENTS

| 2014/0002031 A1* | 1/2014 | Chaturvedi ......... H01M 10/443 320/152 |
| 2014/0062415 A1* | 3/2014 | Barsukov ............ H02J 7/00041 320/134 |
| 2014/0084873 A1* | 3/2014 | Sim ...................... H02J 7/0091 320/134 |
| 2015/0066837 A1* | 3/2015 | Twarog ............... H01M 10/443 706/58 |
| 2016/0185238 A1* | 6/2016 | Morikawa ............... B60L 50/40 320/134 |
| 2016/0185248 A1* | 6/2016 | Aoshima ........... H01M 10/4257 701/22 |
| 2016/0329612 A1* | 11/2016 | Jung ......................... H02J 7/00 |
| 2017/0163069 A1* | 6/2017 | Morikawa ........... H01M 10/482 |

FOREIGN PATENT DOCUMENTS

| WO | WO 2015/019873 A1 | 2/2015 |
| WO | WO 2015/019875 A1 | 2/2015 |
| WO | WO 2016/006462 A1 | 1/2016 |

OTHER PUBLICATIONS

Japanese-language Written Opinion (PCT/ISA/237) issued in PCT Application No. PCT/JP2018/003904 dated May 1, 2018 (three pages).
Extended European Search Report issued in European Application No. 18777126.6 dated Oct. 8, 2020 (six (6) pages).

* cited by examiner

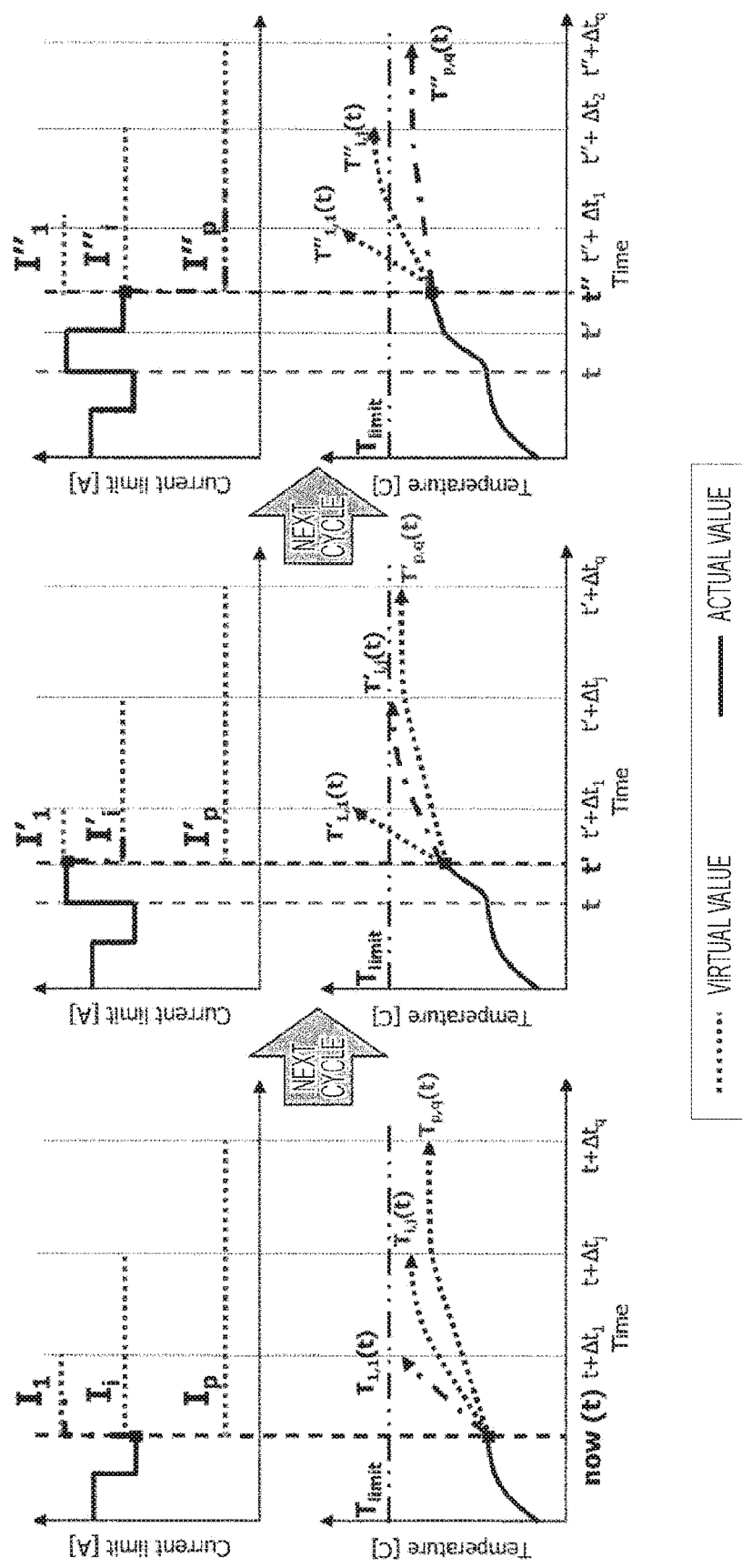

BATTERY ENERGY STORAGE SYSTEM, BATTERY MANAGEMENT SYSTEM, AND CONTROL METHOD FOR CONTROLLING BATTERY TEMPERATURE

TECHNICAL FIELD

The invention relates to a battery management system which controls a charging/discharging process to secure a battery cell temperature to be equal to or less than a maximum value, and a battery energy storage system which performs such a method.

BACKGROUND ART

In recent years, many countries are considering reducing greenhouse gas emissions due to climate change and global warming.

A battery energy storage system (hereinafter, abbreviated to as BESS) for smart grid and transportation generally include a plurality of battery cells, a power electronics device, a cooling system which controls a battery cell temperature, and a battery management system to secure an operation state stable. In the case of the battery system which includes such a cooling system, the system is designed and controlled such that the cooling system keeps the cell temperature to be equal to or less than a predetermined maximum value.

In addition, in recent years, the size and weight of the battery system are also reduced furthermore, and lightened. One of solutions is to reduce the cooling system in order to make the battery system reduced in size and weight. Therefore, demands for a naturally-cooled battery system is increased in which a forcibly cooling mechanism (cooling system).

In the battery system of such a natural cooling, the cooling performance is not sufficient depending on an operation condition or an ambient condition. Therefore, the temperature is expected to rise up to a maximum allowable value. In particular, when the battery cell temperature reaches a limit value, a charging/discharging process is necessarily stopped until the battery cell temperature is reduced. As a result, a utilization of the battery system is reduced.

In consideration of the above problem, there is required a battery system in which the battery cell temperature is kept to be equal to or less than the use limit temperature, and a time taken for returning to the charging/discharging process is shortened even if a frequency for the battery system to stop the charging/discharging process is reduced and the charging/discharging process is stopped.

CITATION LIST

Patent Literature

PTL 1: US 2009/0085527 A1

SUMMARY OF INVENTION

Technical Problem

PTL 1 discloses a charging system and a charging method in which the battery cell can be charged such that a surficial battery cell temperature does not exceed the use limit temperature. In the case of using the method, a temperature rising estimation is performed on an assumption that the charging is performed at the present charging value. Therefore, if the current is set as above, the current is controlled to be increased in a case where an estimated temperature is lower than a target temperature range, and decreased in a case where the estimated temperature is higher than the target temperature range.

However, in many applications, a future charging/discharging current is not possible to be estimated, and is not necessarily equal to the present value of the past value. Therefore, PTL 1 fails to consider that the charging/discharging current is likely to be changed in a future and the battery cell temperature is dynamically changed in various operations conditions and ambient conditions. Such an application may have a possibility that the battery system suddenly stops.

In consideration of the above problem, an object of the invention is to provide a battery system in which a battery cell does not exceed a use limit temperature, and a time taken for returning to the charging/discharging process is shortened even if a frequency for the battery system to stop a charging/discharging process is reduced and the charging/discharging process is stopped.

Solution to Problem

In order to solve the above problem, the battery system disclosed in the invention includes a plurality of battery cells and a control circuit which controls a charging/discharging current of the battery cell. The control circuit performs a plurality of temperature rising estimations on the basis of a battery temperature, a charging/discharging current, and a time width of a time window. The control circuit selects the charging/discharging current corresponding to a temperature rising estimation in which the battery cell temperature does not exceed a use limit temperature among the temperature rising estimations.

Advantageous Effects of Invention

With a battery system of the invention, a battery cell does not exceed a use limit temperature, and a time taken for returning to the charging/discharging process can be shortened even if a frequency for the battery system to stop a charging/discharging process is reduced and the charging/discharging process is stopped.

BRIEF DESCRIPTION OF DRAWINGS

FIGS. 7A to 7C are graphs illustrating a plurality of temperature estimations and selections of the current limit.

DESCRIPTION OF EMBODIMENTS

Hereinafter, the invention will be described.

First Embodiment

Figure 1:
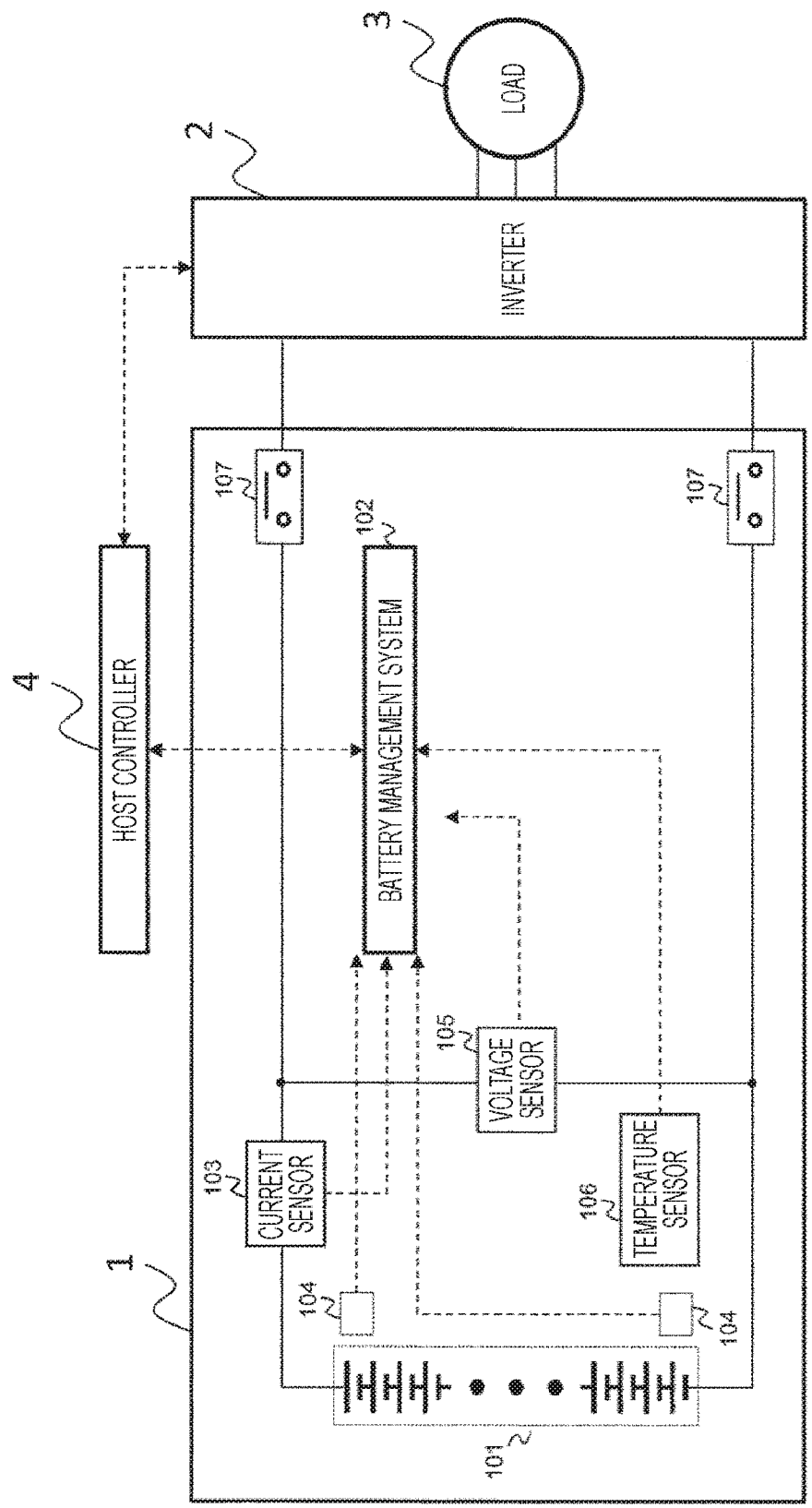
FIG. 1 is a diagram schematically illustrating a naturally-cooled battery system which is connected to a load.

FIG. 1 illustrates a schematic view of a naturally-cooled battery system 1 connected to a load 3 through an inverter 2. The inverter 2 and the battery system 1 both are monitored by a host system controller 4. The battery system 1 includes a battery cell 101, a battery management system 102, a current sensor 103, a voltage measurement circuit 104 which measures a voltage of each battery cell, a voltage sensor 105 which measures a total current of a plurality of battery cells 101 connected in series, a temperature sensor 106, and a relay 107. The battery system 1 is connected to the host system controller 4 through a communication cable through which information can be transmitted bidirectionally.

The naturally-cooled battery system 1 is not provided with a cooling device such as a fan or a cooling plate to keep the temperature of the battery cell 101 to be equal or lower than the use limit temperature $T_{limit}$. Therefore, the temperature of the battery cell 101 is significantly changed according to an electrochemical reaction, a phase change, a Joule heat, and an ambient condition in a charging/discharging process. In particular, a charging/discharging current is significantly influenced by the temperature of the battery cell.

According to the invention, the current flowing to the battery cell 101 is limited. Therefore, a steep temperature rise can be reduced, and the temperature of the battery cell 101 can be secured within the use limit temperature.

Figure 2:
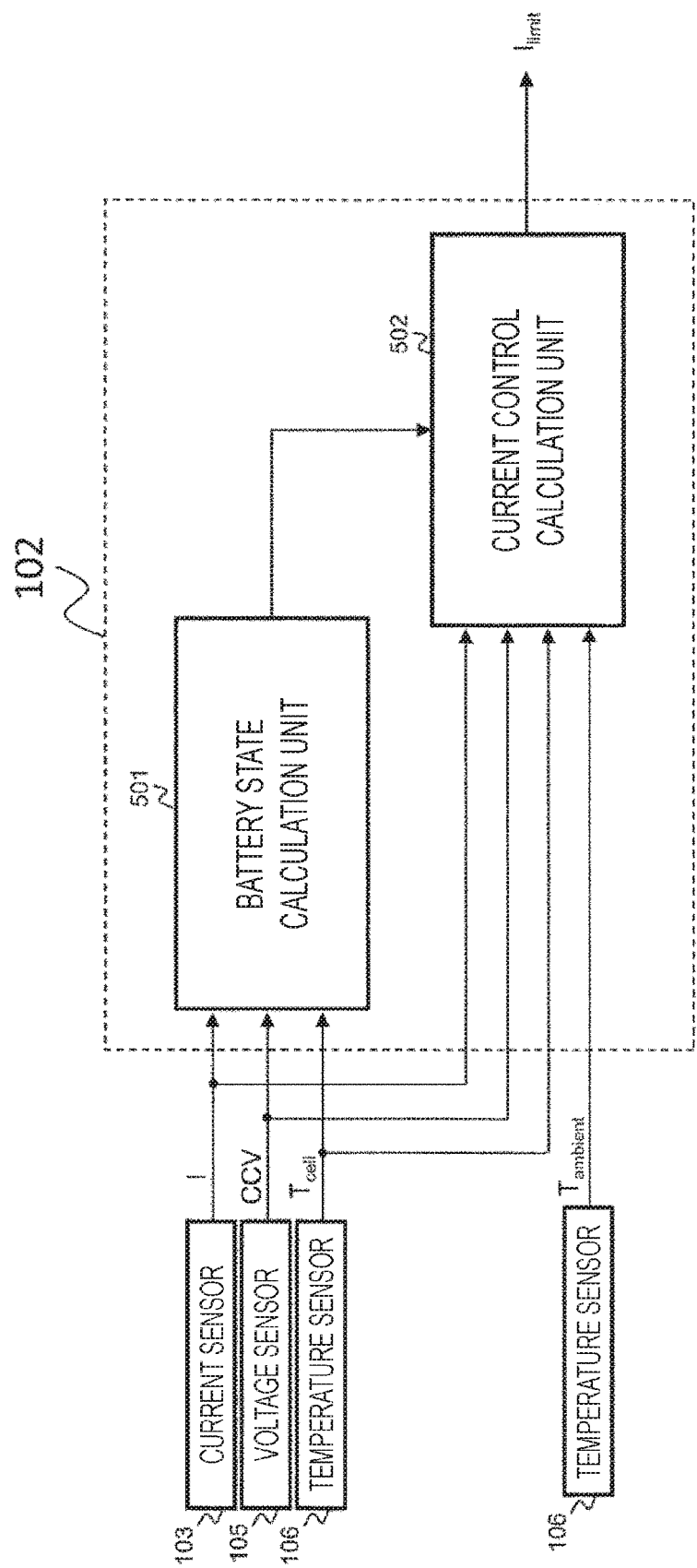
FIG. 2 is a control block diagram for describing a temperature control and an optimal charging/discharging limit of the naturally-cooled battery system.

Then, the content of the battery management system 102 will be described. FIG. 2 is a diagram illustrating a block diagram of the battery management system 102. The battery management system 102 includes a battery state calculation unit 501 and a current limit calculation unit 502. The battery state calculation unit 501 receives an actual current I from the current sensor 103, a closed circuit voltage (hereinafter, abbreviated to as CCV) from the voltage sensor 105, and information of a battery cell temperature from the temperature sensor 106. The battery state calculation unit 501 calculates real states of the battery such as an open circuit voltage (hereinafter, abbreviated to as OCV), a polarized voltage Vp, a state of charge (hereinafter, abbreviated to as SOC), and a state of health (hereinafter, abbreviated to as SOH). Then, in the current limit calculation unit 502, the actual current I, the closed circuit voltage CCV, the battery cell temperature, an external temperature $T_{ambient}$, and information from the battery state calculation unit 501 are input. $I_{limit}$ is calculated such that a charging/discharging current command does not exceed an upper current limit, and is transmitted to a host controller 4.

Figure 3:
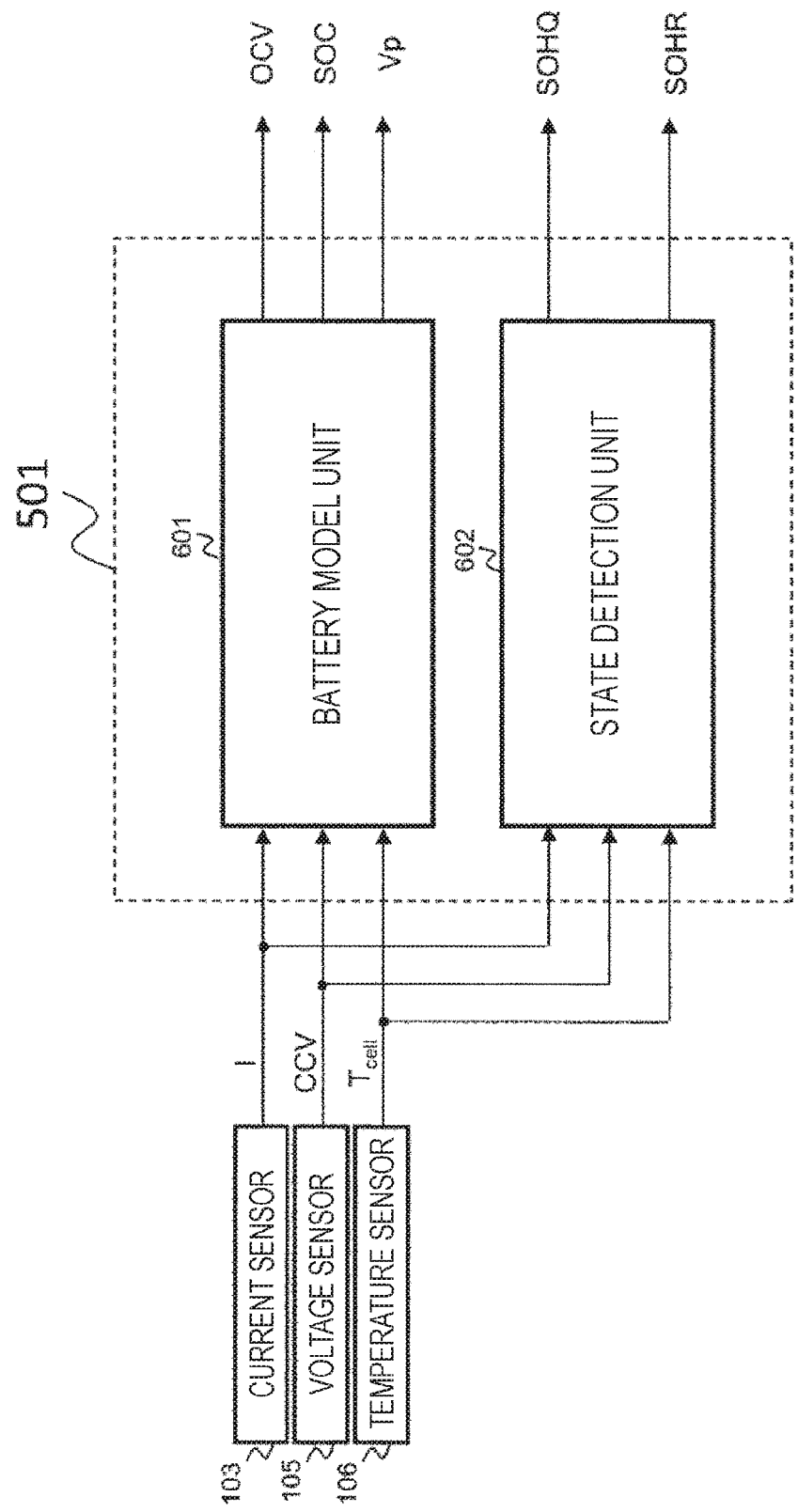
FIG. 3 is a block diagram of a battery state calculation unit.

Subsequently, the content of the battery state calculation unit 501 will be described. FIG. 3 is a block diagram illustrating an example of the battery state calculation unit 501. The battery state calculation unit 501 consists of a battery model unit 601 and the state detection unit 602. The battery model unit 601 includes an equivalent circuit of the battery cell, and includes as information thereof the configuration of the battery system 1 (that is, the number of series and the number of connection cells in one string, and the number of parallel strings).

In addition, the battery model unit 601 receives information of the actual current value I, a total voltage value, and the battery cell temperature from the current sensor 103, the voltage sensor 105, and the temperature sensor 106, and calculates the open circuit voltage OCV of the battery cell 101, the polarized voltage $V_p$, and the state of charge SOC.

The battery cell 101 is degraded in capacity and increased in internal resistance according to an operation state and an environment condition. Therefore, a state detection unit 602 receives the same information (the information from the current sensor 103, the voltage sensor 105, and the temperature sensor 106) as the information input to the battery model unit 601 as input information. The state detection unit 602 estimates and outputs capacity degradation information ($SOH_Q$) and internal resistance increase information ($SOH_R$) which are degradation condition of the battery cell.

Figure 4:
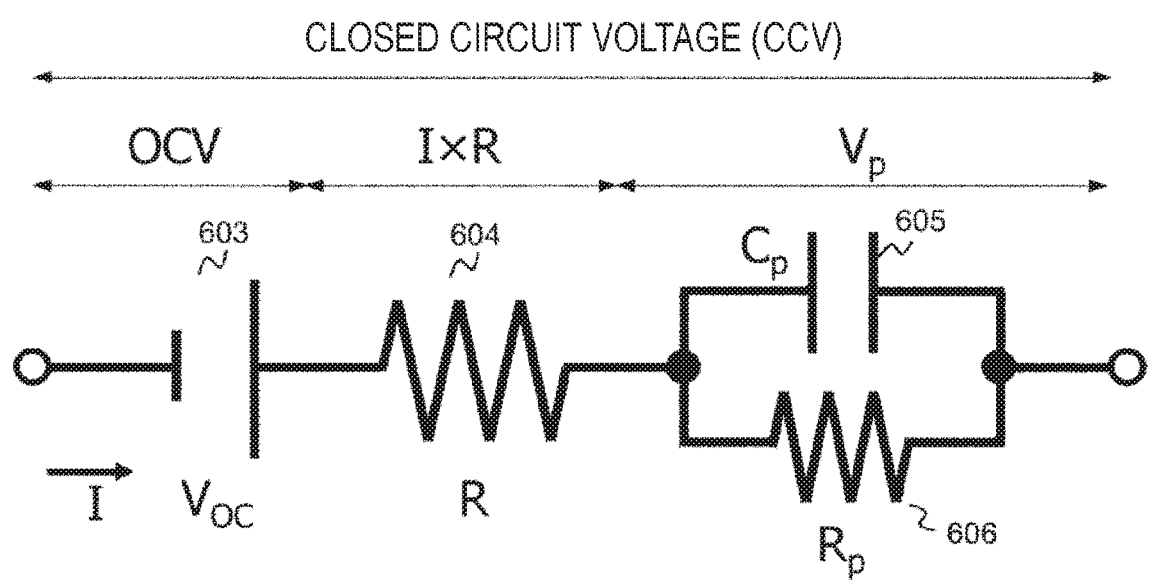
FIG. 4 is a diagram illustrating an example of an equivalent circuit of a battery cell.

FIG. 4 illustrates an example of an equivalent circuit of the battery cell which is mounted in the battery model unit 601. The equivalent circuit of the battery cell includes an open circuit voltage source ($V_{oc}$) 603 which is connected to an internal resistance R 604 in series, and a capacity circuit 605 and a resistance circuit 606 which re an RC parallel circuit to simulate the polarization. In this embodiment, the open circuit voltage OCV, the polarized voltage $V_p$, and the state of charge SOC are calculated using the battery model.

Figure 5:
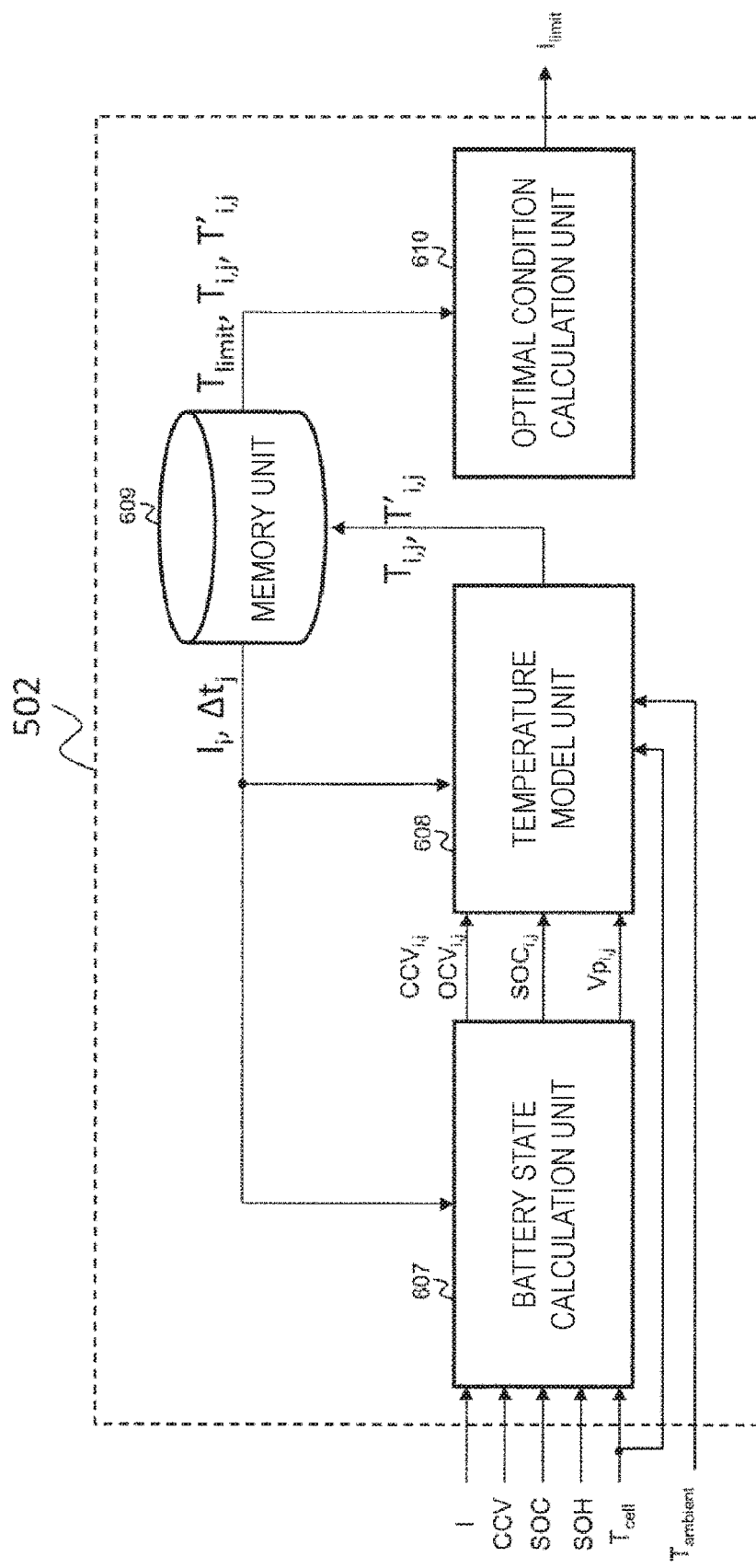
FIG. 5 is a block diagram illustrating a charging/discharging current limit calculation unit according to the invention.

Subsequently, the details of a current control calculation unit 502 will be described. The feature of the invention is in the current control calculation unit 502, and a plurality of temperature rising estimations (virtual information) corresponding to a plurality of constant currents is calculated. FIG. 5 is a block diagram of the current control calculation unit 502. The current control calculation unit 502 includes a battery state calculation unit 607, a temperature modeling unit 608, a memory unit 609, and an optimal condition calculation unit 610. The specific control and calculation will be described using FIG. 6.

Figure 6:
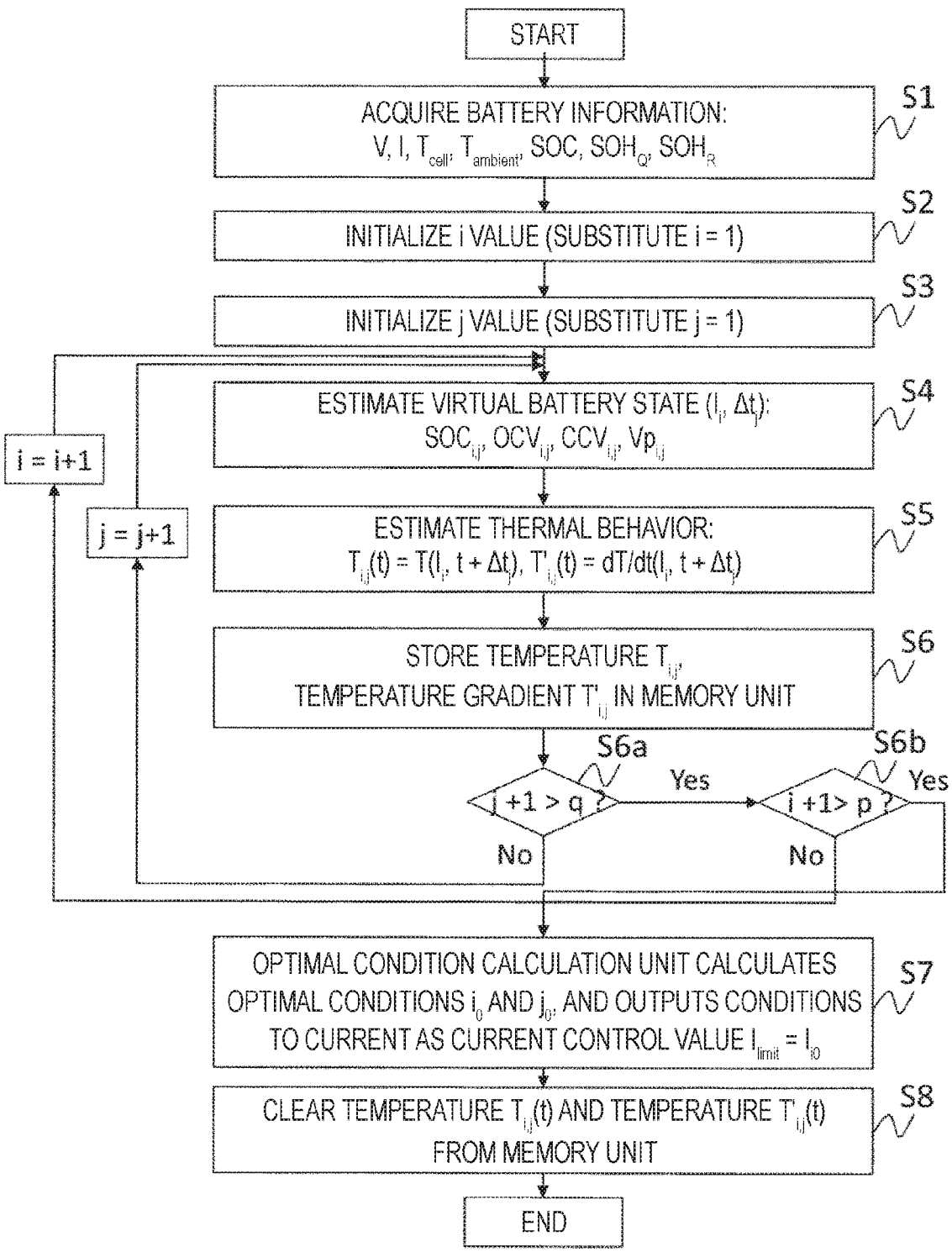
FIG. 6 is a flowchart of a charging/discharging current limit calculation according to the invention.

FIG. 6 is a flowchart for describing the procedure of the current limit calculation unit 502 to calculate the charging/discharging current $I_{limit}$ of a maximum capacity.

First, in the first step S1, the current control calculation unit 502 acquires the actual voltage V, the actual current I, the battery cell temperature $T_{cell}$, an ambient temperature $T_{ambient}$ of the battery system, and the state of charge SOC calculated by the battery state calculation unit 501, the capacity degradation information $SOH_Q$, and the internal resistance increase information $SOH_R$ which are actual battery information from the current sensor 103, the voltage sensor 105, the temperature sensor 106, and the battery state calculation unit 501.

Subsequently, the battery state calculation unit 607 determines a plurality of virtual currents $I_i$ ($1 \leq i \leq p$, i and p are integers, and p is an arbitrarily fixed value) which are included between 0 and a maximum current Imax of the system, and a plurality of virtual time windows $\Delta t_j > 0$ ($1 \leq j \leq q$, j and q are integers, and q is an arbitrarily fixed value). Therefore, i and j are initialized to 1 in steps S2 and S3. Then, these values are stored in the memory unit 609.

Further, the time window corresponds to time when the current flows. The time window is very a significantly important value to determine how much flowing current causes the temperature of the battery cell 101 to reach the upper limit depending on the value.

Subsequently, in step S4, the battery state calculation unit 607 acquires the virtual current $I_i$ and the virtual time window $\Delta t_j$ which are output from the memory unit 609 in addition to the actual current I, the closed circuit voltage CCV, the state of charge SOC, the state of health SOH, and the battery cell temperature $T_{cell}$. Then, an open circuit voltage $OCV_{i,j}$, a total voltage $CCV_{i,j}$, a charging current $SOC_{i,j}$, and a polarized voltage $Vp_{i,j}$ are calculated for a combination ($I_i$, $\Delta t_j$) ($1 \leq i \leq p$, $1 \leq j \leq q$) of the virtual current $I_i$ which is an expecting value from t (present) to t+$\Delta t_j$ (future) and the virtual time window $\Delta t_j$.

Then, in step S5, the temperature modeling unit 608 receives these estimated results, and estimates a thermal behavior of the battery cell 101 in a case where the virtual current $I_i$ is applied.

At this time, the temperature modeling unit 608 calculates temperature $T_{i,j}(t)=T(I_i, t+\Delta t_j)$ and $T'_{i,j}(t)=dT/dt$ which is a derivative (temperature gradient) of temporal change of the temperature.

Then, a thermal behavior in a case where the virtual current $I_i$ (constant current) in the virtual time window $\Delta t_j$ is calculated using the actual temperature as an initial value. As an example, the thermal behavior of the battery cell 101 is obtained by analyzing an energy balance equation (Expression 1).

[Expression 1]

$$mc\frac{dT}{dt} = R \cdot I^2 + V_p \cdot I + I \cdot T \cdot \frac{\partial C_{OC}}{\partial T} - hA(T - T_{ambient}) \quad \text{(Expression 1)}$$

Subsequently, the procedure proceeds to step S6, and the temperature $T_{i,j}$ and the temperature gradient $T'_{i,j}$ in the memory unit 609. Then, the procedure proceeds to step S6a to compare j to q. In a case where j is smaller than q (j+1>q is not satisfied), the procedure returns to before step S4, and substitutes j+1 to j to repeat steps S4 to S6. On the other hand, in a case where j is larger than q (j+1>q is satisfied), the procedure proceeds to step S6b to perform the same calculation even on the value of i as the calculation of j (in the case of i, it is determined whether i+1>p). Then, all the estimated results $T_{i,j}(t)$, $T'_{i,j}(t)$, 1≤i≤p, and 1≤j≤q are stored in the memory in step S6. Further, the processes of step S6a and step S6b may be switched. In a case where the performance of the processing device is high, the processes of step S6a and step S6b may be performed at the same time.

Subsequently, the process of the optimal condition calculation unit 610 will be described. The procedure proceeds from step S6b to step S7. All the estimated results and the use limit temperature $T_{limit}$ are input to the optimal condition calculation unit 610. Then, the optimal condition calculation unit 610 selects one combination $(I_{i0}, \Delta t_{j0})$ from among all the combinations $(I_i, \Delta t_j)$ (1≤i≤p≤j≤q) stored in the memory unit 609, and calculates $I_{i0}$ to satisfy the following Expression 2 for example.

[Expression 2]

$$\begin{cases} T_{i0,j0}(t) < T_{limit} \\ i0, j0 \text{ which maximize } I_i \times \Delta tj \text{ and minimize } T'_{ij}(t) \end{cases} \quad \text{(Expression 2)}$$

Then, an absolute charging/discharging current limit $I_{limit}$ is set to $I_{i0}$.

Finally, in step S8, all the temperatures $T_{i,j}(t)$, the temperature gradients $T'_{i,j}(t)$, 1≤i≤p, and 1≤j≤q are cleared from the storage unit 609, and the flow ends.

FIG. 7 illustrates a result in a case where the invention is applied. The changes (the upper drawings) of the current limit from t to t" and the changes (the lower drawings) of the temperature of the battery cell 101 at that time are illustrated. FIG. 7(a) is a diagram illustrating the result at the present time t, in which the solid portion illustrates a current history and a temperature history, and a two-dot-chain line illustrates a use limit temperature. Using the control described in FIG. 6, The change of the temperature of the battery cell 101 is illustrated in a case where the current value I at the present time t is set to the virtual value (broken-line portion) to be changed to the virtual currents $I_1$, $I_i$, ..., and $I_p$. Further, the virtual current $I_1$ corresponds to the virtual temperature change $T_{1,1}(t)$, the virtual current $I_i$ corresponds to the virtual temperature change $T_{i,j}(t)$, and the virtual current $I_p$ corresponds to the virtual temperature change $T_{p,q}(t)$.

FIG. 7(a) illustrates a case where an optimal solution obtained by the optimal condition calculation unit 610 becomes $(I_1, \Delta_{t1})$ at time t by an output request (for example, a request for a large current flowing up to t+$\Delta_{t1}$). Then, the charging/discharging current is limited to $I_1$ for a while until the current reaches t' of FIG. 7(b).

On the other hand, even in a case where the current is limited to $I_1$, the internal resistance is increased more than expected depending on a charging/discharging pattern, and the temperature may start to rise steeply. In this case, since the limit current is set to $I_1$, the temperature of the battery cell 101 comes to exceed the use limit temperature $T_{limit}$. Therefore, in a case where the process of FIG. 6 is performed again at time t' as illustrated in FIG. 7(b), and there is a request for the current to flow up to time t'+$\Delta t_j$, the virtual current $I'_i$ is selected not to exceed the use limit temperature $T_{limit}$ to limit the charging/discharging current I to $I'_i$ for a while. Then, similarly in a case where the temperature of the battery cell 101 steeply rises more than expected until t" (for example, a case where the external temperature steeply rises), the temperature of the battery cell 101 exceeds the use limit temperature $T_{limit}$ since the limit current is $I'_i$. Therefore, in a case where the process of FIG. 6 is performed again at time t" as illustrated in FIG. 7(c), and there is a request for the current to flow up to time t"+$\Delta t_q$, the virtual current $I''_p$ is selected not to exceed the limit temperature $T_{limit}$ to limit the charging/discharging current I to $I''_p$ for a while. Thereafter, the process is repeated so as to provide the battery control such that the temperature does not exceed the limit temperature $T_{limit}$ while outputting an extremely high power. With the current limit method of the invention, the temperature gradient is reduced, so that the risk of reaching the Tlimit value is restricted. Further, in FIG. 7, the virtual current having a highest utilization of the battery cell 101 is selected. However, there is no need to select the virtual current having the highest utilization depending on a request. In this case, the battery 101 is unlikely to be stopped by an unexpected rising temperature.

Then, the invention will be summarized simply.

The battery system 1 of the invention includes the plurality of battery cells 101 and a control circuit 102 which controls the charging/discharging current of the battery cell 101. The control circuit 102 performs a plurality of temperature rising estimations on the basis of temperature information ($T_{cell}$ and $T_{ambient}$) the charging/discharging current (I, $I_i$), and a time width ($\Delta t_j$) of the time window. The control circuit 102 selects the charging/discharging current ($I_i$) which corresponds to the temperature rising estimation in which the temperature does not exceed the use limit temperature of the battery cell among the temperature rising estimations. With such a configuration, even if it is not possible to estimate a future charging/discharging, the battery cell 101 does not exceed the use limit temperature. If the frequency for the battery system to stop the charging/discharging process is reduced, and the charging/discharging process is stopped, it is possible to provide a battery system which is shortened in time taken for returning to the operation.

In addition, in the battery system 1 disclosed in the invention, the temperature sensor 106, the current sensor 103, and the voltage sensor 105 are provided. The control circuit 102 includes the calculation unit 501 which calculates the state of charge SOC and the state of health SOH of the battery cell, and the other battery parameters. With such a configuration, it is possible to estimate an accurate thermal behavior compared to the battery modeling.

In addition, according to the battery system 1 disclosed in the invention, as a specific example, the control circuit 102 includes the memory unit 609 which stores a plural pieces of current information and the time widths of a plurality of time windows. A plurality of temperature rising estimation is performed on the basis of the current information I, the time width Δt of the time window, and the present operation situation.

In addition, according to the battery system 1 disclosed in the invention, the control circuit 102 secures the battery cell 101 to be equal to or less than the use limit temperature during the plurality of temperature rising estimations, and the optimal condition calculation unit 610 selects the temperature rising estimation in which the utilization of the battery cell 101 is increased. With this configuration, the temperature does not reach the use limit temperature while maximizing the utilization of the battery cell 101. It is possible to keep a balance between the maximizing of the utilization of the battery 101 and the suppressing of the reaching to the use limit temperature.

Second Embodiment

Subsequently, a second embodiment will be described. In an application such as a hybrid electric vehicle, additional information such as an estimation operation time, an operation pattern, a user operation style, a flat/inclined road, and weather information may be available through a car navigation system.

These pieces of information data may be transmitted to the memory unit 610 of the current limit calculation unit 502, or may be used to select a set of $\Delta t_j$ to be considered in the plurality of temperature estimations.

With the use of such information, it is possible to improve the accuracy of calculating a more optimized condition.

Third Embodiment

Subsequently, a third embodiment will be described. For example, in a power grid application where the battery system is installed to smoothing the output power of a photovoltaic power plant, the photovoltaic power may be estimated a day before, and a charging/discharging requirement of the battery system may be estimated.

The plurality of temperature estimations may be performed on the basis of different current limit values and the time values of the time windows to be optimized. As a result, a current limit schedule may be acquired, and the temperature control may be performed with more accuracy.

Hitherto, the invention has been summarized simply.

The invention may be modified such that the current limit value is dynamically changed according to an operation condition and an ambient condition. In other words, the current limit value depends not only on a difference between $T_{limit}$ and $T_{cell}$, but the optimal condition is changed even by the time width of the time window of the control. Therefore, the temperature of the battery cell 101 can be controlled with more accuracy by the optimization condition calculation unit and by sequentially selecting an optimal condition the time window thereof. In addition, the invention is effectively applied to a system which is naturally cooled without a cooling control.

In addition, the invention is not limited to the above embodiments. Modifications may be considered in the invention.

As an example, the temperature modeling unit 608 may use a model other than the temperature model disclosed the invention of (Expression 1).

In addition, a battery state calculation unit 607 is not necessarily different from the battery state calculation unit 501. For example, only the battery state calculation unit 501 may be used.

In addition, a required input for the temperature modeling unit 608 is not limited to those described above, but may be another input value related to the battery information instead of the battery information.

In addition, the invention is not limited to the battery system which is naturally cooled. The method can be implemented even in a forcibly-cooled battery system, and also used to improve the reliability of the battery control system by the cooling system, or to reduce a running cost of the system.

According to the invention, in the battery management system, the utilization of BESS can be maximized, and the battery cell temperature can be secured to be equal to or less than the use limit temperature.

Hitherto, the description has been made about the embodiments of the invention, but the invention is not limited thereto. Various modifications may be made in design within a scope not departing from the spirit of the invention disclosed in claims. For example, the above-described embodiments have been described in detail in a clearly understandable way, and are not necessarily limited to those having all the described configurations. In addition, some of the configurations of a certain embodiment may be replaced with the configurations of the other embodiments, and the configurations of the other embodiments may be added to the configurations of the subject embodiment. Further, some of the configurations of each embodiment may be omitted, replaced with other configurations, and added to other configurations.

REFERENCE SIGNS LIST 1 battery system
2 inverter
3 load
4 host controller
101 battery cell
102 battery management system
103 current sensor
104 voltage measurement circuit
105 voltage sensor
106 temperature sensor
107 relay

The invention claimed is:
1. A battery system, comprising:
a plurality of battery cells;
a temperature sensor;
a current sensor;
a voltage sensor; and a control circuit configured to:
   control a charging/discharging current of the battery cells,
   calculate a state of charge and a state of health of the battery cells,
   store different current limit values and different time widths of time windows,
   select an optimum combination from combinations of the current limit values and the time widths of the time windows, and
   select, in a next cycle, the optimum combination relative to temperature information and a charging/discharging current at a time of the next cycle,
   wherein the optimum combination ensures that a temperature of the battery cells does not exceed a use limit temperature of the battery cells and utilization of the battery cells increases.

* * * * *